(12) United States Patent
Samukawa (10) Patent No.: US 6,348,158 B1
(45) Date of Patent: Feb. 19, 2002

(54) PLASMA PROCESSING WITH ENERGY SUPPLIED

(75) Inventor: Seiji Samukawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/359,194

(22) Filed: Jul. 22, 1999

(30) Foreign Application Priority Data

Jul. 23, 1998 (JP) ............................................. 10-208069

(51) Int. Cl.⁷ .................................................. C23F 1/00
(52) U.S. Cl. ............................. 216/67; 216/63; 216/64; 216/65; 216/69; 216/61; 427/569; 427/575; 438/730
(58) Field of Search ............................... 216/61, 63, 65, 216/64, 67, 69; 427/569, 575; 438/730

(56) References Cited

U.S. PATENT DOCUMENTS 6,025,117 A * 2/2000 Nakano et al. ............. 430/314

FOREIGN PATENT DOCUMENTS

| JP | 61-256727 | 11/1980 |
| JP | 62-76627 | 4/1987 |
| JP | 62-194623 | 8/1987 |
| JP | 64-90534 | 4/1989 |
| JP | 4-181727 | 6/1992 |
| JP | 5-29613 | 2/1993 |
| JP | 5-247673 | 9/1993 |
| JP | 6-122978 | 5/1994 |
| JP | 6-132252 | 5/1994 |
| JP | 6-181185 | 6/1994 |
| JP | 8-13151 | 1/1996 |
| JP | 8-27577 | 1/1996 |
| JP | 9-260292 | 10/1997 |

* cited by examiner

Primary Examiner—Michael Kornakov
(74) Attorney, Agent, or Firm—Hutchins, Wheeler & Dittmar (57) ABSTRACT

In a plasma processing method, a plasma is generated using a process gas, and an electron beam is injected into the plasma to control an electron energy distribution in the plasma. Then, a semiconductor substrate is processed using the plasma with controlled electron energy distribution.

15 Claims, 5 Drawing Sheets

Fig. 6A UHF POWER
Fig. 6B ELECTRON BEAM
Fig. 6C ACTIVE A ION
Fig. 6D ACTIVE B RADICAL

Fig. 7A UHF POWER
Fig. 7B ELECTRON BEAM
Fig. 7C ACTIVE A ION
Fig. 7D ACTIVE B RADICAL

Fig. 8A
Fig. 8B

PLASMA PROCESSING WITH ENERGY SUPPLIED

BACKGROUND OF THE INVENTION

1. Field of the Invention

The present invention relates to a method and apparatus for processing a semiconductor substrate by use of a plasma, and more particularly to a plasma processing of a semiconductor substrate with energy supplied.

2. Description of the Related Art

Integration density of an integrated circuit as a main device of microelectronics has been increased. With the increase of the integration density, a pattern width becomes narrower so that the processing such as etching and deposition to a semiconductor substrate with large irregularity is required. To fill the above-mentioned requirement, there are provided a lot of methods of processing of a semiconductor device by use of plasma.

For example, a plasma etching method at a low pressure (under high vacuum) has been developed as an etching technique for a thin film (Japanese Laid Open Patent Applications: JP-A-Showa 61-256727, JP-A-Showa 62-194623, JP-A-Heisei 5-247673, and JP-A-Heisei 6-132252). In these conventional techniques, various dry etching apparatuses are used such as a plasma etching apparatus, a sputtering apparatus, an electron cyclotron resonance (ECR) etching apparatus, a magnetron etching apparatus, and an ion beam etching apparatus. An etching rate increases by employing a gas containing halogen such as Freon based gas (for example, $CF_4$ and the like) during processing of a semiconductor substrate by a dry etching method using plasma. Consequently, a fine pattern processing can be realized. Also, in a thin film deposition technique, a halogen based gas such as $TiCl_4$, $WF_6$ is dissociated, and the deposition at a low temperature and at a high rate can be realized.

However, there has been limitations in processing precision, when the etching for fine patterns is performed, or a film is deposited on a micro-processed irregular surface.

First, a problem of the fine pattern etching will be described below. For example, when contact holes are formed in an $SiO_2$ insulating film of a semiconductor device by an etching method, the limitation of a selection ratio is known to be about 50 when an etching rate is kept at a value not less than 1 $\mu$m/min. Here, the selection ratio is a ratio of an etching rate to a $SiO_2$ film formed on a silicon substrate or a nitride film to an etching rate of the silicon substrate or the nitride film.

That is, when the contact holes are formed, over-etching is performed to completely open the holes in consideration of the deviation of processes. This means that the silicon substrate or the nitride film is simultaneously etched away by 1/50 of the thickness of the $SiO_2$ film. As a result, the silicon substrate is inevitably etched away to some extent.

In the semiconductor device such as a metal oxide semiconductor large-scale integrated device (MOSLSI device), there arises a problem in which a silicon substrate is etched to a p-n junction layer which has been formed under the contact hole in conjunction with the increase of the integration density. For this reason, new countermeasures such as deposition of a polymer on the silicon substrate or a nitride film using a fluorocarbon gas are required.

The reason in which a satisfactory selection ratio can not be attained will be described below. Let's consider a case where an etching process is performed at a high rate by use of a high density plasma. When a $C_4F_8$ gas plasma is generated, radicals and $C_xF_y^+$ ions having high energy are generated in the plasma through a complex dissociation process such as $C_4F_8 \rightarrow C_4F_7 \rightarrow C_3F_5 \rightarrow C_2F_4 \rightarrow CF_2 \rightarrow CF \rightarrow C+F$. In the plasma, electron energy is not less than about 5 eV, which is relatively high. Therefore, a dissociation rate of the $C_4F_8$ gas becomes high. Thus, radical species such as $CF_2$ are rare which act as a precursor necessary for obtaining a high selection ratio. Therefore, an important problem is that desired radical species or desired ion species are selectively generated.

To address the above-described problem, there is disclosed conventional methods in which electron energy is reduced in a low pressure and high density plasma (Japanese Laid Open Patent Applications: JP-A-Heisei 5-029613, and JP-A-Heisei 6-122978). In these methods, dissociation in the plasma is relatively restrained, and a lot of radicals contributing to an improvement in selectivity are generated, compared with the conventional methods. However, a problem is remaining in that an ion current density injected into a semiconductor substrate is reduced and the etching rate is also reduced, since an amount of high-energy electrons which contribute to ionization is relatively small. On the other hand, there is known a method in which a plasma is generated by supplying electrons whose energy is controlled by an electron beam. In this method, although dissociation and ionization can be accurately controlled, ionization requiring high energy and dissociation requiring low energy cannot simultaneously occur. Also, a plasma having a high density cannot be homogeneously generated across a large diameter. As a result, there gives rise to problems for practical use.

Next, deposition on an irregular surface of a semiconductor substrate will be described below. For example, when a thin film is deposited on the semiconductor substrate by use of a UHF plasma using a $C_4F_8$ gas as a process gas, it is preferable that a lot of CF radicals are generated. In such a case, low permittivity, high heat resistance, and superior embedding property are attained. However, in the above-described UHF plasma, $CF_2$ and $CF_3$ are mainly generated, so that satisfactory properties are not accomplished.

In conjunction with the above description, a dry etching apparatus is described in Japanese Laid Open Patent Application (JP-A-Showa 62-76627). In this reference, a gas inside a chamber is exhausted by an exhausting unit. Then, a reactive gas is introduced into a chamber. A power is applied between opposing parallel plate electrodes to generate a discharge between the electrodes. A sample is located on one of the opposing electrodes. An electron beam is supplied into a discharge plasma generated between the electrodes. In this dry etching apparatus, however, a parallel plate electrode structure is adopted. Therefore, an electron energy distribution is broad. As a result, it is difficult to apply the apparatus to a very fine pattern processing.

Also, a plasma reacting apparatus is described in Japanese Laid Open Patent Application (JP-A-Showa 64-90534). In this reference, opposing parallel plate electrodes are provided in a chamber and a plasma is generated between the electrodes. An electron beam is supplied between the electrodes. Thus, etching or deposition is performed to a substrate located on one electrode.

Also, a dry etching apparatus is described in Japanese Laid Open Patent Application (JP-A-Heisei 4-181727). In this reference, an etching gas is introduced in a chamber, and opposing electrodes are provided in the chamber. A high frequency power is applied to the electrodes to cause a glow discharge to generate a plasma. An electron gun outputs an electron beam toward the electrodes and the electron beam is scanned on the semiconductor wafer.

Also, a plasma surface processing apparatus is described in Japanese Laid Open Patent Application (JP-A-Heisei 6-181185). In this reference, an electron beam is irradiated to a plasma source gas to generate a plasma. At this time, an electron distribution of electrons irradiated is modulated with respect to space and time. A high frequency bias is applied to a wafer holder in synchronous with the modulation so that the plasma is modulation with respect to time. Thus, a semiconductor wafer is etched.

Also, an electron beam exciting plasma film forming apparatus is described in Japanese Laid Open Patent Application (JP-A-Heisei 8-27577). In this reference, two electron beams with high energy and low energy are provided. A plasma is generated through excitation by the electron beam. When the electron beam with high energy is irradiated, a plasma PBa composed of gas molecules which require high activation energy for ionization or dissociation is generated. When the electron beam with low energy is irradiated, a plasma PBb composed of gas molecules which require low activation energy for ionization or dissociation is generated. The respective plasma are used to perform chemical vapor deposition on a sample for formation of a multi-element thin film.

Also, a plasma CVD apparatus is described in Japanese Laid Open Patent Application (JP-A-Heisei 8-13151). In this reference, an electron beam gun is provided concentrically to a plasma generating region. A mixture gas which is difficult to be ionized is introduced from a port close to an acceleration electrode and a mixture gas which is easy to be ionized is introduced from a port apart from the acceleration electrode. A probe detects generated ions and radicals to feedback the detecting result to the acceleration power supply for controlling the energy of electron beam. A current of an inverse magnetic field coil is controlled to cancel the magnetic field.

Also, a method of manufacturing a fine crystal film is described in Japanese Laid Open Patent Application (JP-A-Heisei 9-260292). In this reference, a row material gas introduced into a reaction chamber is kept at the pressure of 0.5 to 50 mTorr. The row material gas is set to a plasma state by use of electrons accelerated by an electron beam gun such that ions or radicals are deposited on a substrate.

SUMMARY OF THE INVENTION

Therefore, an object of the present invention is to provide a method and apparatus for plasma processing, in which an electron beam is injected into a plasma to a control an electron energy distribution.

In order to achieve an aspect of the present invention, in a plasma processing method, a plasma is generated using a process gas, and an electron beam is injected into the plasma to control an electron energy distribution in the plasma. Then, a semiconductor substrate is processed using the plasma with controlled electron energy distribution.

The plasma is generated by a high frequency signal of 300 MHz or above.

The process gas preferably is such a gas as halogen radicals and halogen ions can be generated from the process gas in the plasma, and contains at least one gas selected from the group consisting of $CF_4$, $C_4F_8$, $CHF_3$, $C_2F_6$, $Cl_2$, HBr and $BCl_3$. The process gas may further contain a gas used to control kinds of and densities of the halogen radicals and halogen ions to be generated. For example, the process gas further contains at least one gas selected from the group consisting of $O_2$, $H_2$, $N_2$, He, Ar and Xe. The process gas may be a gas, from which radicals as precursor can be generated. For example, the process gas contains at least one gas selected from the group consisting of $CH_4$, $C_2F_4$, $SiH_4$, $AlCl_3$, $TiCl_4$ and $WF_4$.

The plasma is one of UHF plasma, ECR plasma, induction coupling plasma and helicon wave plasma.

It is preferable that the energy of the electron beam is controlled depending upon a kind of active species to be generated, and the electron beam has energy in a range of 1 to 100 eV.

The electron beam may be modulated with respect to time or pulse-modulated. In this case, a pulse energy height of the modulated electron beam is controlled depending upon a kind of first active species to be generated, and a time period of a pulse is shorter than a life time of second active species, which should exist together with the first active species.

When the electron beam includes first and second types of electron beams, the first and second types electron beams may be separately pulse-modulated. Thus, a pulse energy height of the first type of modulated electron beam is controlled depending upon a kind of first active species to be generated, and a time period of a pulse is shorter than a life time of second active species, which should exist together with the first active species. Also, a pulse energy height of the second type of modulated electron beam is controlled depending upon a kind of third active species to be generated, and a time period of a pulse is shorter than the life time of the second active species and a life time of fourth active species, whereby the first to fourth active species coexist in the plasma.

In order to achieve another aspect of the present invention, a plasma processing method includes:

generating plasma using a process gas; and injecting an electron beam into the plasma to produce desired active species in the plasma, wherein the desired active species are used for processing a semiconductor substrate.

In order to achieve still another aspect of the present invention, a plasma processing apparatus includes a chamber, plasma generating antennas, an electron beam source section and a control unit. The plasma generating antennas generates a plasma in the chamber in response to a signal, using a process gas. The electron beam source section includes at least one electron beam source and injects an electron beam group into the plasma to control an electron energy distribution in the plasma. The control unit controls an energy of the electron beam group. Thus, a semiconductor substrate located in the chamber is processed using the plasma with controlled electron energy distribution.

The plasma generating antennas may be provided in the chamber, or outside the chamber.

Also, the electron beam source section may be provided on sides of the chamber, or on an upper portion of the chamber.

The control unit control controls the electron beam source section such that the electron beam is modulated with respect to time. Instead, the control unit control may control the electron beam source section such that the electron beam is pulse-modulated. In this case, a pulse energy height of the modulated electron beam is controlled depending upon a kind of first active species to be generated, and a time period of a pulse is shorter than a life time of second active species, which should exist together with the first active species.

Also, when the electron beam source section includes a plurality of electron beam sources, the control unit control may control the electron beam source section such that first and second types of electron beams are irradiated, the first and second types electron beams are pulsemodulated. In this case, a pulse energy height of the first type of modulated electron beam is controlled depending upon a kind of first active species to be generated, and a time period of a pulse is shorter than a life time of second active species, which should exist together with the first active species. Also, a pulse energy height of the second type of modulated electron beam is controlled depending upon a kind of third active species to be generated, and a time period of a pulse is shorter than the life time of the second active species and a life time of fourth active species, whereby the first to fourth active species coexist in the plasma.

DESCRIPTION OF THE PREFERRED EMBODIMENTS

A plasma processing apparatus of the present invention will be described below in detail with reference to the attached drawings.

In a method of plasma processing of the present invention, a plasma is irradiated to a substrate such that the substrate is processed. Most electrons are generated based on a high frequency signal. An electron beam is controlled by a control unit and provides energy necessary for ionization or dissociation of active species. As a result, ion species or radical species necessary for the substrate processing can be selectively obtained.

Any plasma can be used as long as the plasma is generated using a high frequency signal. The plasmas such as ultra high frequency (UHF) plasma, electron cyclotron resonance (ECR) plasma, inductively coupled plasma, helicon wave plasma, and the like can be used. A UHF signal is preferable and it is more preferable for the UHF signal to have the frequency equal to or more than 300 MHz. This is because an electron energy distribution is positively produced such that a lot of low energy electrons exist. In this case, the electron energy distribution can be much drastically changed through irradiation of an electron beam.

Figure 2A:
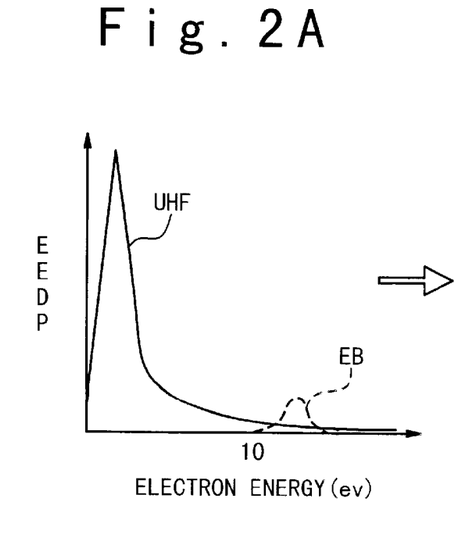
FIG. 2A is a diagram showing a conventional example of an electron energy distribution in a plasma.

FIG. 2A shows a usual electron energy distribution in the UHF plasma. The vertical axis indicates an electron energy distribution profile (EEDP) and the horizontal axis indicates an electron energy (eV). The discharge frequency of 500 MHz is used for generation of the plasma. A solid line in FIG. 2A indicates the electron energy distribution in the UHF plasma. As seen from FIG. 2A, most electrons has as low energy as about 3 eV. A dashed line in FIG. 2A indicates an energy distribution of an electron beam.

An energy distribution of electrons to be injected by the electron beam can be appropriately chosen depending on a kind of process gas and ion species or radical species required for processing a semiconductor substrate. The energy of the electrons to be injected is preferably about 100 eV or less in consideration of ionization potentials of elements in a process gas currently used.

In addition, the electron beams may be modulated by the control unit with respect to time, while the UHF plasma discharge is continuously performed. In this case, required active species can be produced. Also, when the electron beam is subjected to a pulse modulation, specific active species can be periodically produced. Specifically, when the electron beam is subjected to the pulse modulation with a pulse period shorter than a life time of active species, a plurality of kinds of active species can be produced at the same time.

An etching process of an insulating film on a semiconductor substrate can be conducted by use of radical species or ion species through the selection of the energy of the electron beam used for the plasma. In addition, it is possible that an interlayer insulating film for a wiring layer is formed through deposition of selected radical species or ion species on the substrate surface.

A process gas which can produce halogen radicals or halogen ions in the plasma is particularly preferable when an insulating film on the semiconductor substrate is subjected to plasma etching. In this case, the process gas such as $CF_4$, $C_4F_8$, $CHF_3$, $C_2F_6$, $Cl_2$, $HBr$, $BCl_3$ is preferable. The process gas may be a single gas of them or a mixture gas of them. In addition, a gas such as $O_2$, $H_2$, $N_2$, $He$, $Ar$, or $Xe$ may be added to the process gas in order to control a kind or concentration of the produced radical species or ion species. A mixed gas of them may be used as the process gas depending on the process.

When the insulating film is formed on the semiconductor device by use of radical species or ion species through the selection of the energy of the electron beam used for the plasma, any process gas producing radicals as a precursor can be utilized. For example, the process gas such as $CH_4$, $C_2F_4$, $SiH_4$, $AlCl_3$, $TiCl_4$ and $WF_4$ can be used.

An apparatus for realizing the above described plasma processing method includes a plasma generating unit for producing a high frequency plasmas in a plasma generating chamber, and an electron beam (EB) generating unit for irradiating an electron beam into the plasma generating chamber. The plasma generating unit may utilize a high frequency plasma such as a UHF plasma, ECR plasma, inductive coupled plasma, and helicon wave plasma. Any electron beam generating unit may be available as long as the electron beam having an energy in a range from 1 to 100 eV can be injected. FIGS. 1, 3A and 3B, and 4A and 4B show schematic diagrams of plasma processing apparatuses to the first to third embodiments of the present invention.

These are etching apparatuses using a UHF plasma generating unit, but not limited to this.

Figure 1:
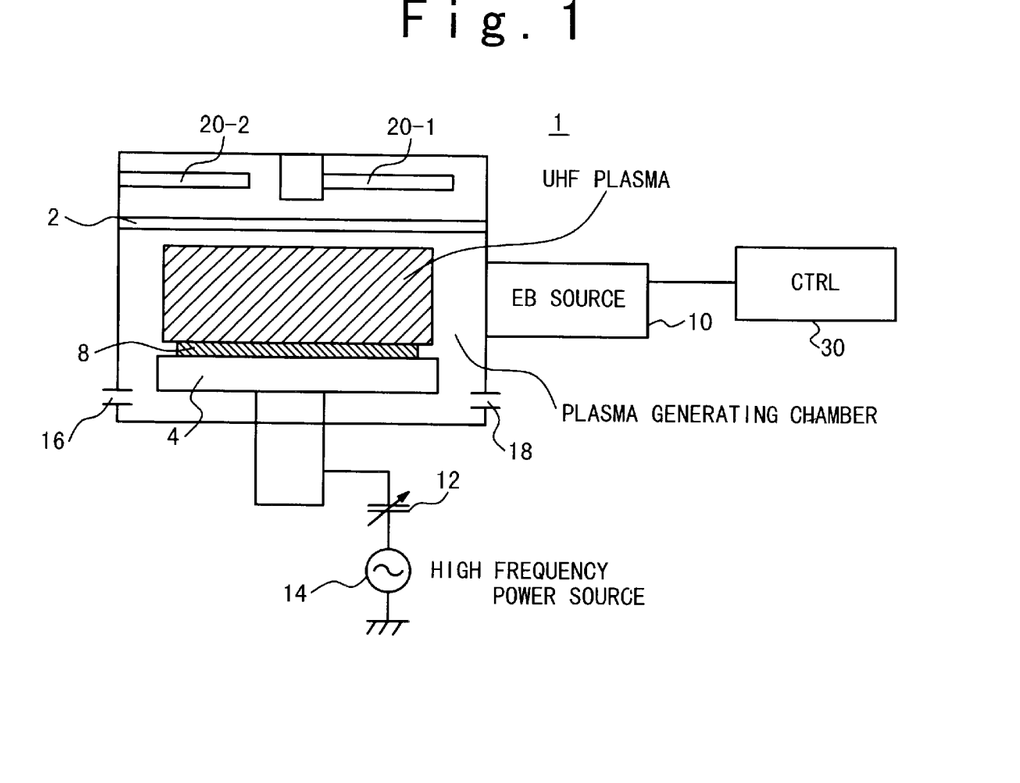
FIG. 1 is a schematic diagram of an apparatus for plasma processing according to a first embodiment of the present invention.

FIG. 1 is a schematic diagram showing the plasma processing apparatus according to the first embodiment of the present invention. Referring to FIG. 1, the plasma processing apparatus is composed of UHF antennas 20-1 and 20-2, upper and lower electrodes 2 and 4, a variable capacitor 12, a high frequency power source 14, inlet and outlet 16 and 18 for a process gas, a control unit 30 and an electron beam source 10. The UHF antennas 20-1 and 20-2 are provided in an upper portion in a plasma processing (generating) chamber, and the upper and lower electrodes 2 and 4 are provided below the UHF antennas 20-1 and 20-2 in the plasma processing chamber. A semiconductor substrate 8 is located on the lower electrode 4.

In FIG. 1, a UHF plasma is generated by the UHF antennas 20-1 and 20-2 in response to a high frequency signal. This plasma processing apparatus can be used, when the plasma is generated at a pressure of several mTorr. In this case, a mean free path of an electron becomes several cm. Accordingly, in the UHF plasma in which a magnetic field is not generated, the electrons injected by the electron beam easily diffuse, so that plasma density tends to be not homogeneous.

Figure 3A:
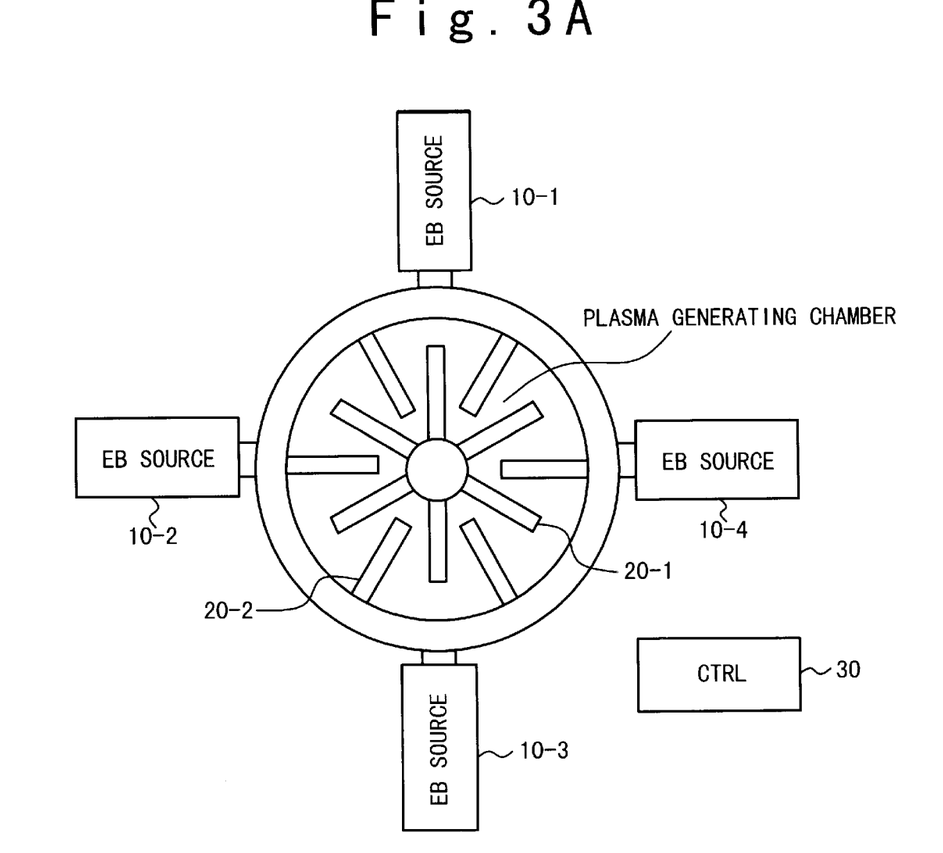
FIGS. 3A and 3B are a plan view and a cross section view of a plasma processing apparatus according to a second embodiment of the present invention.
Figure 3B:
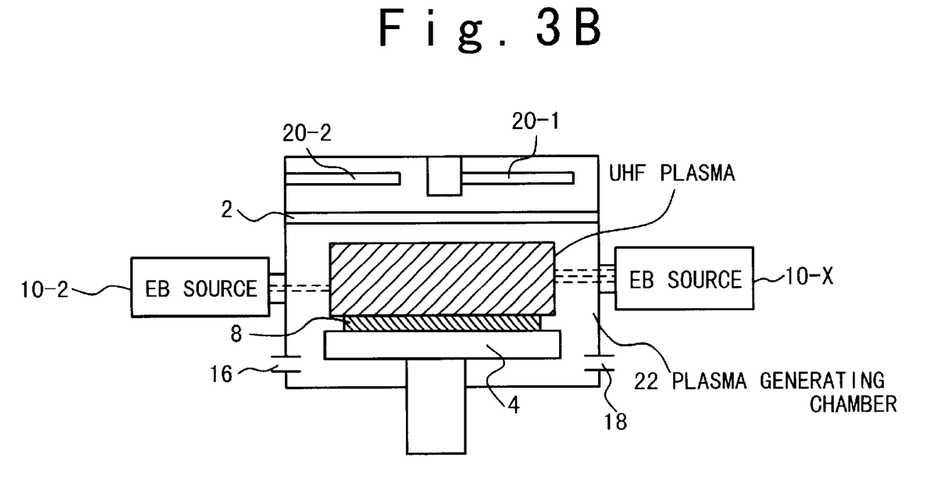

FIGS. 3A and 3B are schematic diagrams of the plasma processing apparatus according to the second embodiment of the present invention. FIG. 3A is a top plan view, and FIG. 3B is a longitudinal sectional view. In FIGS. 3A and 3B, the arrangement and number of the electron beam sources are designed to produce a homogeneous plasma density.

This plasma processing apparatus in the second embodiment is composed of UHF antennas 20-1 and 20-2, upper and lower electrodes 2 and 4, electron beam sources 10-1 to 10-4, inlet and outlet 16 and 18 for a process gas and a control unit 30. The variable capacitor 12 and the high frequency power source 14 are not shown. The UHF antennas 20-1 and 20-2 are provided in an upper portion in a plasma processing (generating) chamber, and the upper and lower electrodes 2 and 4 are provided below the UHF antennas 20-1 and 20-2 in the plasma processing chamber. The semiconductor substrate 8 is located on the lower electrode 4. A process gas is supplied into the plasma processing chamber via the inlet 16 and exhausted from the outlet 18. The control unit 30 controls the electron beam sources 10-1 to 10-4 such that desired electron beams are generated.

As seen from FIGS. 3A and 3B, the four electron beam sources 10-1 to 10-4 are provided to irradiate electron beams from four directions into the plasma processing chamber, in this embodiment. This plasma processing apparatus is useful, when a plasma pressure is high, and an amount of electrons produced in the UHF plasma are equal to or more than as an amount of electrons injected by the electron beam sources 10-1 to 10-4.

Figure 4A:
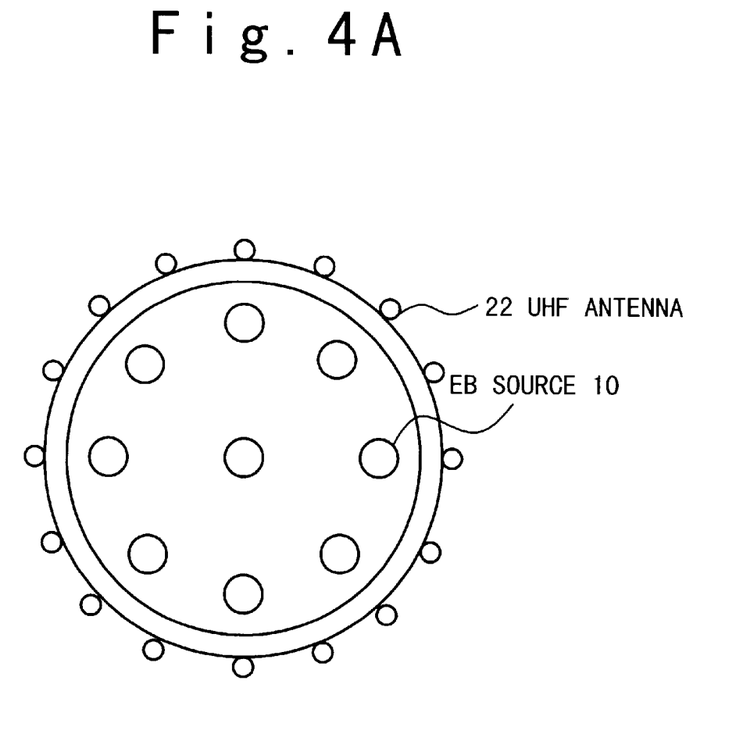
FIGS. 4A and 4B are a plan view and a cross section view of a plasma processing apparatus according to a third embodiment of the present invention.
Figure 4B:
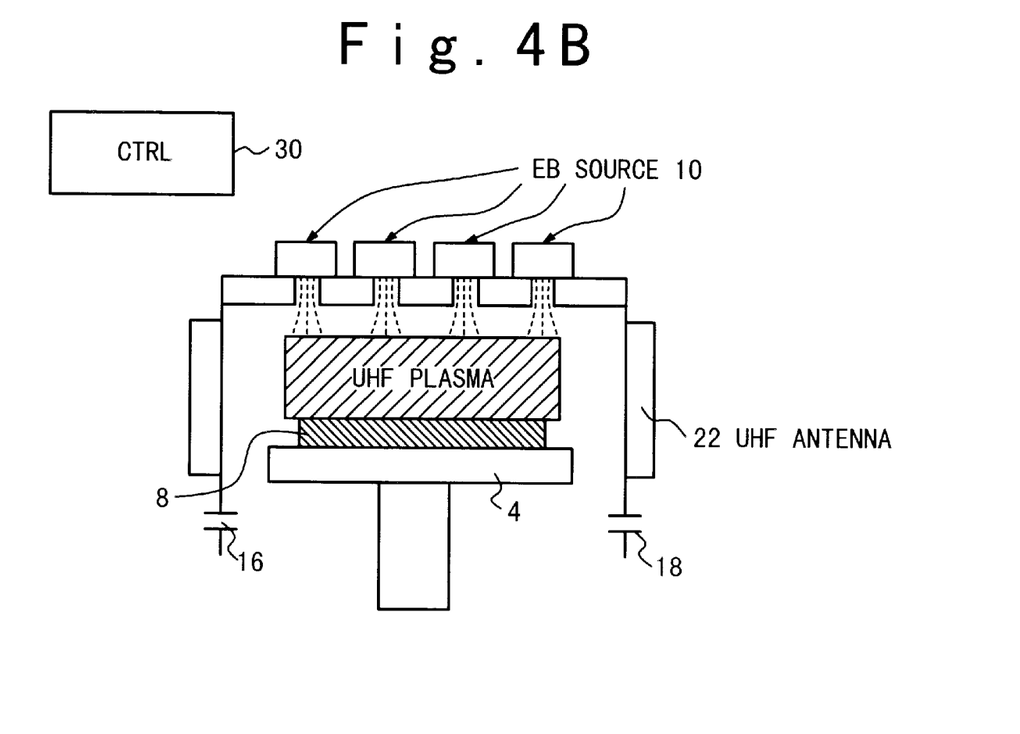

FIGS. 4A to 4B are schematic diagrams showing the plasma processing apparatus according to the third embodiment. FIG. 4A is a top plan view, and FIG. 4B is a longitudinal sectional view. This plasma processing apparatus is useful for plasma processing when it is used for the state having a tendency to be heterogeneous in plasma density due to the same reason as described above.

In FIGS. 4A and 4B, the plasma processing apparatus is composed of UHF antennas 22, a lower base 4, inlet and outlet 16 and 18 for a process gas, a control unit 30 and electron beam sources 10. The UHF antennas 22 are provided outside of the plasma processing (generating) chamber on the side wall. The electron beam sources 10 are provided on the plasma processing chamber. The semiconductor substrate 8 is located on the lower base 4.

Next, the plasma processing will be described below.

First, $SiO_2$ contact hole etching by using the plasma processing method according to the first embodiment of the present invention will be described. In this case, the contact hole has the diameter equal to or smaller than 0.25 $\mu m\phi$, more preferably 0.1 $\mu m\phi$, and the depth of 1 $\mu m$.

A plasma processing apparatus shown in FIG. 1 is used as the apparatus for plasma processing. A plasma is generated by use of a high frequency signal of 500 MHz. In this embodiment, a $C_4H_8$ gas is used as a process gas, and introduced into the plasma processing chamber via the inlet 16.

Figure 2B:
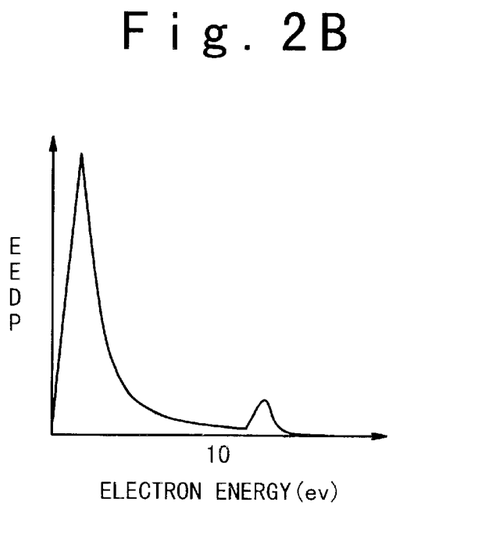
FIG. 2B is a diagram showing an example of an electron energy distribution in a plasma obtained in the first embodiment of the present invention.

As shown in FIG. 2A, the electron energy distribution in the plasma indicates that a lot of electrons exist at the energy of about 3 eV or below. In this energy distribution, the electrons can dissociate only the C—F bond (3 eV) in $C_4H_8$ gas. On the other hand, in case of etching of an oxide film, a collision of ions such as $CF_3^+$ is necessary for dissociation of a Si—O bond. The etching rate is determined based on the density of the ions. Ionization energy of $CF_3^+$ ion is not less than 10 eV, so that a lot of electrons with high energy not less than 10 eV are necessary for producing ions of a high density. Thus, under the control by the control unit 30, there are injected from the electron beam source 10 in high density, electrons having energy not less than 10 eV which is suitable for ionization energy shown by a broken line in FIG. 2A. As a result, a newly obtained electron energy distribution is shown in FIG. 2B. Thus, the electron energy distribution indicates that the electrons are grouped into a group of low energy electrons formed by the UHF electric field and a group of high energy electrons formed by use of the electron beam. This is because electrons are not accelerated in the UHF electric field. At this time, an injected electron density of the electron beam is about 10 to 20% of the density of electrons produced in the UHF plasma. That is, when the density of the UHF plasma is about $10^{11}$ cm$^{-3}$, the injected electron density of the electron beam is about $10^{10}$ cm$^{-3}$.

This electron energy distribution can simultaneously realize the production of low dissociative radials and the production of high energy ions. Therefore, it becomes possible to perform the anisotropic etching of the oxide film in a high etching rate. Thus, the selectivity as a selection ratio equal to or more than 100 and the high etching rate equal to or more than 5000 A/min are simultaneously realized.

Next, the plasma processing according to the second embodiment of the present invention will be described. In this embodiment, a plasma processing method is applied to deposition of an amorphous carbon film as an interlayer insulating film, using a fluorocarbon gas.

The amorphous carbon film is used as the interlayer insulating film for a wiring layer, and is expected as a low permittivity film capable of reducing wiring delay in a semiconductor device in future. The deposition is conducted by use of the plasma using the fluorocarbon gas as a process gas. $CF_x$ radicals functions as precursors, as in the case of etching of the oxide film.

In the film formed using the fluorocarbon gas, an F concentration is a determinant factor for heat resistance and low permittivity. When the F concentration becomes high, the heat resistance becomes poor at a temperature not less than 400° C. and the permittivity also becomes low. A plasma which contains many CF radicals is required to attain both low permittivity and heat resistance. At the same time, when the interlayer insulating film is deposited, embedding property in an irregular surface is important. Therefore, CF radicals having a smaller adsorption coefficient than that of $CF_2$ or $CF_3$ radicals are useful.

Figure 5:
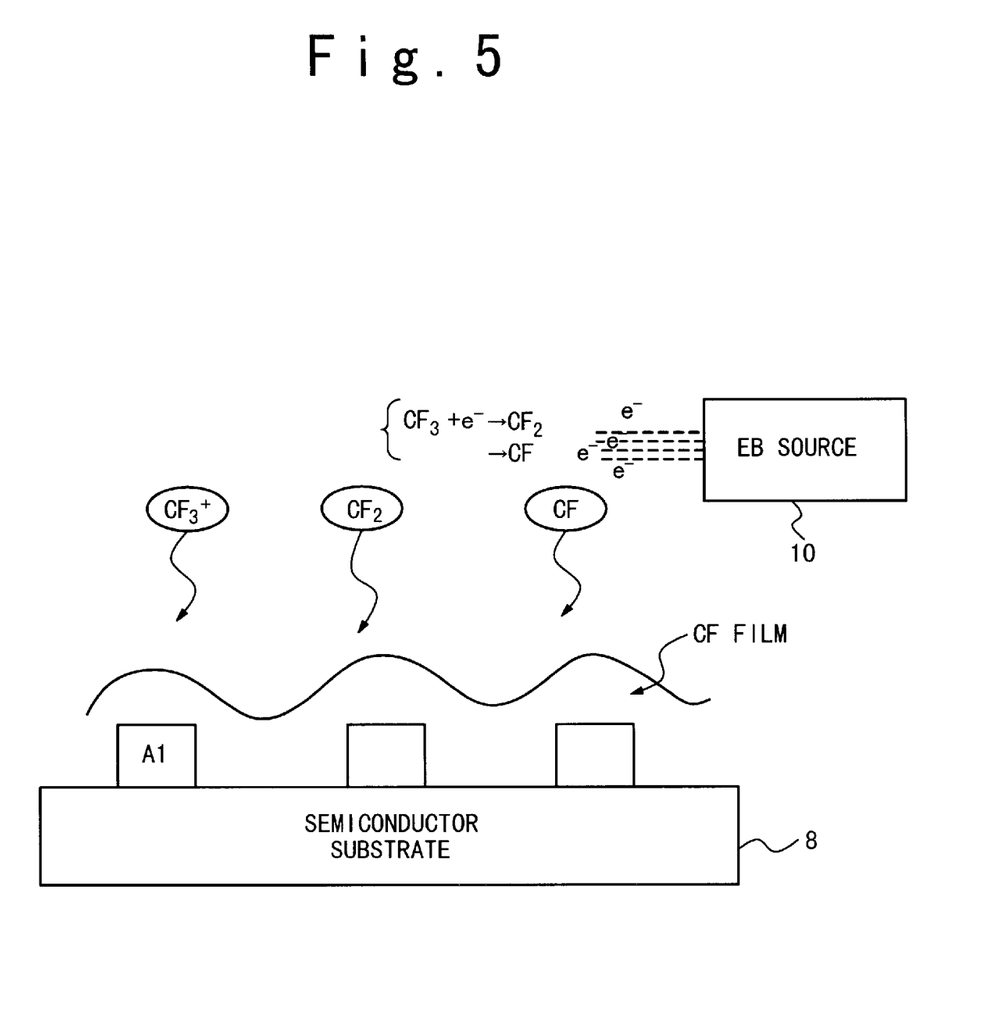
FIG. 5 is a schematic diagram showing a manner in which an insulating film is deposited on a semiconductor substrate by a plasma processing method in accordance with the present invention.

In this case, $CF_2$ and $CF_3$ are main because a peak exists in a lower energy side in the plasma produced by the UHF plasmas. Therefore, an electron beam having an energy necessary to produce CF ions by dissociating F from $CF_2$ and $CF_3$ ions are injected. Thus, CF radicals can be selectively produced. FIG. 5 is a schematic diagram showing that the electron energy is provided from electron beam source (EB) and the dissociation is accelerated, so that a film including more CF ions is formed. In this embodiment, the film is formed through injection of an electron beam having the energy of 20 eV using the plasma processing apparatus shown in FIG. 1.

Next the plasma processing according to the third embodiment of the present invention will be described below.

In the plasma processing in the third embodiment, processing of a semiconductor substrate is performed in the same way as that in the first embodiment other than modulation of an electron beam. In this embodiment, the electron beam is modulated while the UHF plasma is continuously generated. Thus, active radicals are controlled with respect to time. $CF_3^+$ ions with a high density are necessary for etching of an oxide film made of $SiO_2$. When Si or $Si_3N_4$ as a lower layer is exposed during the etching, impact by ions is preferably minimal. Therefore, the control unit 30 controls the electron beam source 10 such that the electron beam having a high energy is injected during etching of the oxide film made of $SiO_2$, as in the first embodiment. On the other hand, the control unit 30 controls the electron beam source 10 such that the injection of the electron beam is stopped when it is detected that Si or $Si_3N_4$ as the lower layer is exposed. As a result, the selectivity of etching to the lower layer is improved.

Next, the plasma processing according to the fourth embodiment of the present invention will be described below.

Figure 6A:
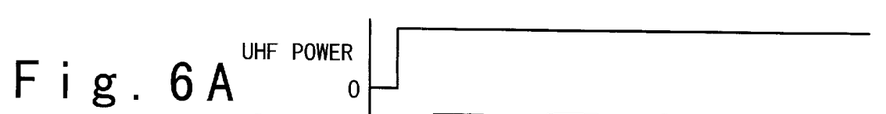
FIGS. 6A to 6D are timing charts when a pulse modulation is performed to an electron beam in the present invention.

Like the third embodiment, the electron beam is modulated while the UHF plasmas are continuously generated. Thus, the generation of active radicals are controlled with respect to time. However, as shown in FIG. 6A, pulse modulation of the electron beam is specific to this embodiment. In FIGS. 6A to 6D, the horizontal axis represents time and the vertical axis represents change in an amount with no unit. A UHF power is turned on at a certain time, then the power remains constant at a certain level. As a result, the UHF plasma is continuously generated. On the other hand, the electron beam is subjected to pulse modulation by the control unit 30 such that the power is switched between 0 and an energy level necessary for generating A ions as active species. At this time, a concentration of B radicals as active species produced by the UHF plasmas and a concentration of A ions as the active species produced by the electron beam are changed in the UHF plasma.

Figure 6B:
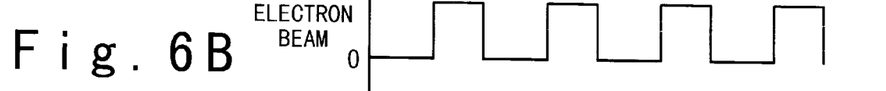
Figure 6C:
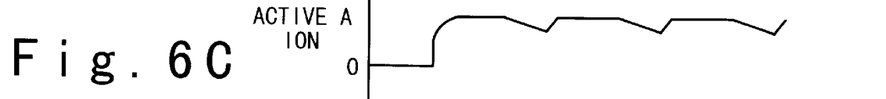
Figure 6D:
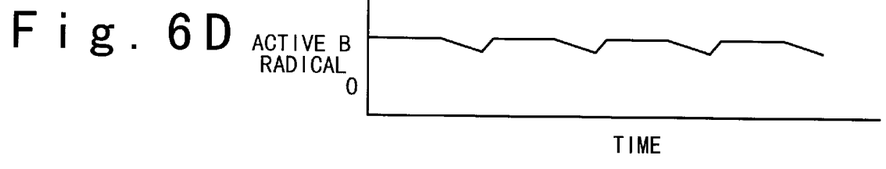
Figures 7A, 7B, 7C:
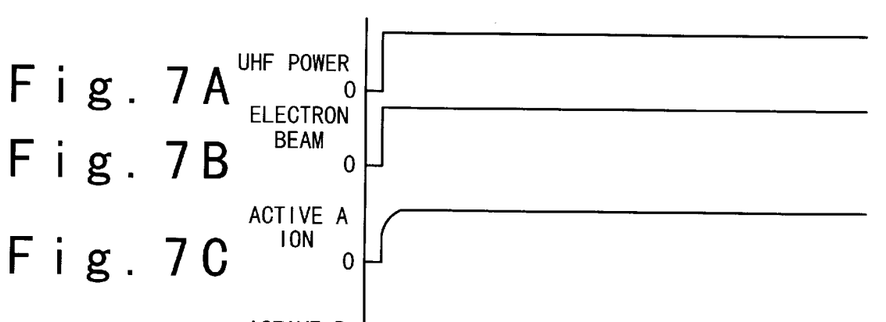
FIGS. 7A to 7D are timing charts when the pulse modulation is not performed to the electron beam in the present invention.
Figure 7D:
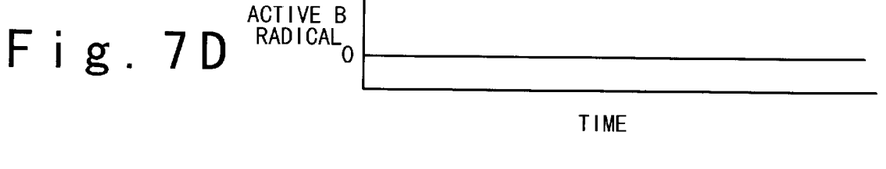

As shown in FIG. 6B, the control unit 30 controls the electron beam source 10 such that the electron beam is subjected to the pulse modulation in a shorter period than the life time of the active species A ions. Therefore, the active species A ions and the active species B radicals can be simultaneously produced in the plasma, as shown in FIGS. 6C and 6D.

FIGS. 7A to 7D show changes in concentrations of the active species A ions and the active species B radicals, when the electron beam is not pulse-modulated. In this case, dissociation is accelerated because of the constant injection of electrons with a high energy by the electron beam, so that the active species B radicals which are necessary for substrate processing are not generate in the plasma.

In this way, when a plurality of active species (ions and radicals) should be simultaneously produced, the electron beam having the energy corresponding to the active species is pulse-modulated at a time period shorter than the life time of the active species. Thus, a plurality of active species can be constantly produced. As a result, the kind of active species and their concentration ratio can be controlled by the control unit 30 in its period and its energy.

Figure 8A:
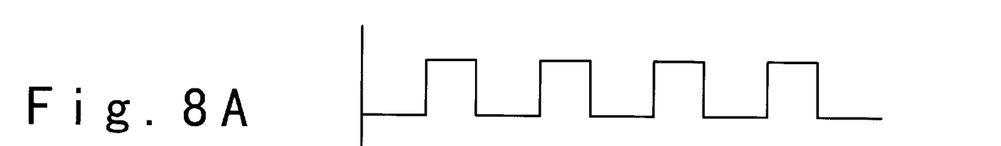
FIGS. 8A and 8B are timing charts when two kinds of pulse modulation are performed to the electron beams in the present invention.
Figure 8B:
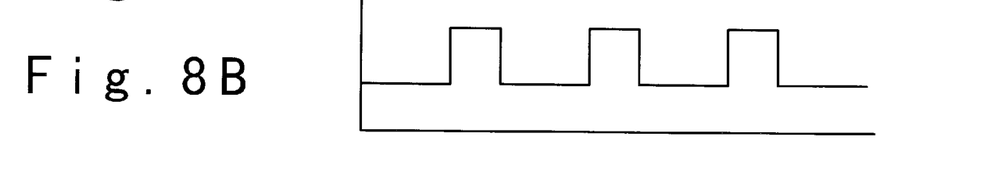

In the above description, the electron beams irradiated from the electron beam sources 10 are controlled by the control unit 30 to have the same energy. However, the present invention is not limited. The electron beams irradiated from the electron beam sources 10 may be controlled by the control unit 30 to have the different energies. In this case, the desired active species can be produced via a plurality of dissociation steps. Also, the electron beams irradiated from the electron beam sources 10 may be controlled by the control unit 30 such that the electron beams are pulse-modulated at the different timings, as shown in FIGS. 8A and 8B. In this case, if the time periods shown in FIGS. 8A and 8B are shorter than the life times of two kinds of active species, three or four kinds of active species can be used for the plasma processing.

In the present invention, an etching process is performed in a discharge pressure in a range of few mTorr to 100 mTorr. At this time, a frequency of collision of electrons and atoms or molecules is in order of a few tens of MHz to 300 MHz. Therefore, if electrons are accelerated with a high frequency electric field higher than the frequency, an energy supply efficiency to the electrons can be suppressed low. At this time, the electrons are distributed in a low energy region which is suitable for a low dissociation plasma state. In this case, when an electron beam with an energy, radical dissociation species or ions species can be generated in a uniform high density plasma.

As described above, according to the present invention, radical species and ion species, and their concentration ratio can be freely controlled by injecting electron beams into a plasma which is produced by an electric field having a high frequency. When an etching process of a semiconductor device is performed, an oxide film or a nitride film can be anisotropically etched at a high selection ratio. In addition, a micro-loading effect (when the etching diameter is small, the etching depth reduces) can be suppressed. When a film is deposited on a semiconductor substrate using the plasma processing method, radical species to be deposited can be selectively controlled, so that film properties and a deposition rate can be accurately controlled.

What is claimed is:

1. A plasma processing method comprising:
   generating a plasma in response to a high frequency signal using a process gas;
   injecting an electron beam into said plasma to control an electron energy distribution in said plasma; and
   processing a substrate using said plasma with controlled electron energy distribution.

2. A plasma processing method according to claim 1, wherein said plasma is generated by said high frequency signal of 300 MHz or above.

3. A plasma processing method according to claim 1, wherein halogen radicals and halogen ions can be generated from said process gas in said plasma.

4. A plasma processing method according to claim 3, wherein said process gas contains at least one gas selected from the group consisting of $CF_4$, $C_4F_8$, $CHF_3$, $C_2F_6$, $Cl_2$, HBr and $BCl_3$.

5. A plasma processing method according to claim 3, wherein said process gas further contains a gas selected to control and enhance the generation rates and densities of said halogen radicals and halogen ions to be generated.

6. A plasma processing method according to claim 5, wherein said process gas further contains at least one gas selected from the group consisting of $O_2$, $H_2$, $N_2$, He, Ar and Xe.

7. A plasma processing method according to claim 1, wherein said process gas is a gas, from which radicals as precursor can be generated.

8. A plasma processing method according to claim 7, wherein said process gas contains at least one gas selected from the group consisting of $CH_4$, $C_2F_4$, $SiH_4$, $AlCl_3$, $TiCl_4$ and $WF_4$.

9. A plasma processing method according to claim 1, wherein said plasma is one of UHF plasma, ECR plasma, induction coupling plasma and helicon wave plasma.

10. A plasma processing method according to claim 1, wherein an energy of said electron beam is controlled to enhance the generation rate of a selected active species to be generated.

11. A plasma processing method according to claim 1, wherein said electron beam has energy in a range of 1 to 100 eV.

12. A plasma processing method according to claim 1, wherein said electron beam is modulated with respect to time.

13. A plasma processing method according to claim 1, wherein said electron beam is pulse-modulated, wherein a pulse energy height of the modulated electron beam is controlled
to enhance the generation rate of a selected first active species to be generated, and
wherein a time period of a pulse is shorter than a lifetime of a second active species, which should exist together with said first active species.

14. A plasma processing method according to claim 1, wherein said electron beam includes first and second types of electron beams,
wherein said first and second types of electron beams are pulse-modulated,
wherein a pulse energy height of the first type of modulated electron beam is controlled to enhance the generation rate of a selected first active species to be generated, and a time period of a pulse is shorter than a lifetime of a second active species, which should exist together with said first active species, and
wherein a pulse energy height of the second type of modulated electron beam is controlled to enhance the generation rate of a selected third active species to be generated, and a time period of a pulse is shorter than a lifetime of said second active species and a lifetime of a fourth active species, whereby said first to fourth active species coexist together in said plasma.

15. A plasma processing method comprising:
generating plasma in response to a high frequency signal using a process gas; and
injecting an electron beam into said plasma to produce desired active species in said plasma, wherein said desired active species are used for processing a substrate.

* * * * *